United States Patent [19]

Matsumoto

[11] Patent Number: 4,989,074
[45] Date of Patent: Jan. 29, 1991

[54] DIGITAL AUTOMATIC GAIN CONTROL APPARATUS

[75] Inventor: Tokikazu Matsumoto, Osaka, Japan

[73] Assignee: Matsushita Electric Industrial Co., Ltd., Osaka, Japan

[21] Appl. No.: 410,261

[22] Filed: Sep. 21, 1989

[30] Foreign Application Priority Data

Sep. 27, 1988 [JP] Japan .................. 63-241324
Sep. 27, 1988 [JP] Japan .................. 63-241326

[51] Int. Cl.$^5$ .......................... H04N 9/64; H04N 5/52; H04B 1/06; H04B 7/00
[52] U.S. Cl. ................................. 358/21 R; 358/27; 358/174; 455/234; 455/240
[58] Field of Search ............... 358/21 R, 27, 174, 178; 73/900; 455/232, 234, 240, 241, 251

[56] References Cited

U.S. PATENT DOCUMENTS

| | | | |
|---|---|---|---|
| 4,625,240 | 11/1986 | Yablonski et al. | 455/23 X |
| 4,673,970 | 6/1987 | Matsumoto et al. | 358/27 |
| 4,829,593 | 5/1989 | Hara | 455/23 X |

FOREIGN PATENT DOCUMENTS 60-75112 4/1985 Japan .

*Primary Examiner*—James J. Groody
*Assistant Examiner*—Wendy R. Greening
*Attorney, Agent, or Firm*—Stevens, Davis, Miller & Mosher

[57] ABSTRACT

A digital automatic gain control apparatus is provided which controls gain such that when an analog video signal is converted into digital signals for processing, the input of the A-D converter is maintained at a fixed level, and after the analog signal has been converted into digital form, the output of the digital system circuit is also maintained at a fixed level. In this apparatus, an input signal is passed through an analog variable gain amplifier, the signal is converted into digital form, and the output of an A-D converter is passed through a digital variable gain amplifier. The amplitude level of the output of the digital variable gain amplifier is detected by an amplitude detecting unit and is controlled so as to be equal to a specified reference value. At this time, the analog variable gain amplifier is controlled so that the level of the control signal for controlling the digital variable gain amplifier is equal to a specified reference value, thereby maintaining the signal of the A-D converter at a fixed level. Gain control of the analog signal system and the digital signal system, before and after the A-D converter, is effected by a single amplitude detecting unit.

10 Claims, 4 Drawing Sheets

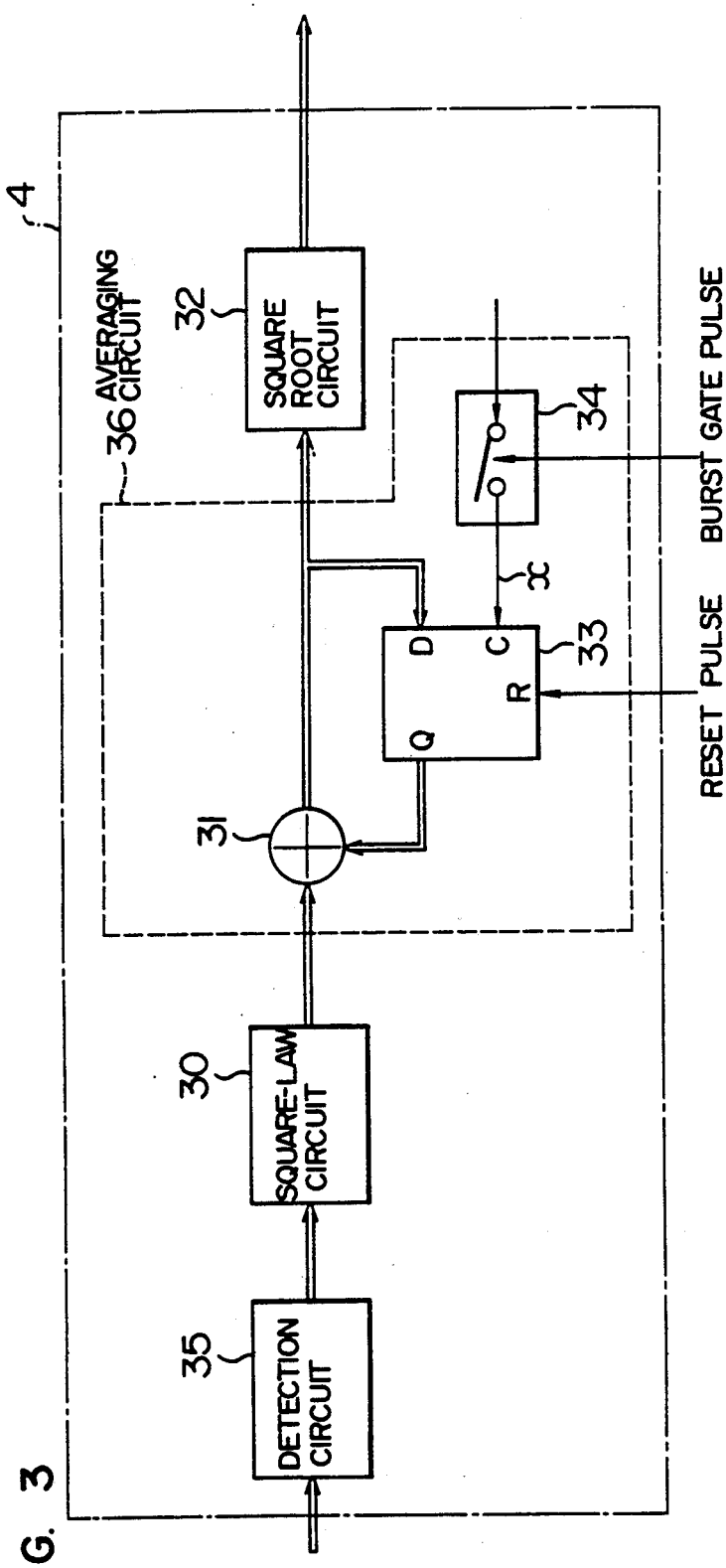
FIG. 3
   
FIG. 4A   CLOCK
FIG. 4B   BURST GATE PULSE
FIG. 4C   $x$
FIG. 4D   RESET PULSE

BURST SIGNAL

BURST GATE PULSE

AVERAGE ABSOLUTE VALUES rms

DIGITAL AUTOMATIC GAIN CONTROL APPARATUS

BACKGROUND OF THE INVENTION

This invention relates to a digital automatic gain control apparatus for controlling the signal so that the signal is at a fixed level in processing the digital signal derived from A-D conversion of video signal in a television set, a video cassette recorder (hereinafter referred to as a VCR), etc.

There has been a growing requirement for digital processing of the video signal. The automatic gain controller (hereinafter referred to as the AGC circuit) has conventionally been a type in which analog data processing is performed. However, the needs has been mounting for AGC circuits in which digital data processing is performed. In digital data processing for gain control, as in analog data processing for gain control, an input signal (video signal) is passed through a variable gain amplifier, a difference between the output and a predetermined reference level is calculated, the difference is integrated, and the result is fed back to the variable gain amplifier, in which the gain is thereby controlled to maintain the output signal at a fixed level.

When the input signal is a signal such as a color signal having added thereto a burst signal which represents the reference level, the burst signal for a fixed period of time is extracted, the level of the extracted burst signal is averaged, the average level obtained is fed back to the variable gain amplifier in which the gain is thereby controlled to maintain the burst signal of the output signal (color signal) at a fixed level.

In such an arrangement, when the level of the input signal is low in relation to the dynamic range of the input to the A-D converter which converts the analog input signal into a digital signal, the output signal of the variable gain amplifier is kept at a fixed level as described above; however, a number of bits of quantization to be allotted to the input signal at the A-D converter is reduced, thus increasing the quantization noise and deterioration the signal-to-noise ratio. Therefore, it is conventionally necessary to increase the number of bits of quantization in the A-D converter or amplify the input signal by providing an analog AGC circuit at the stage previous to the A-D converter in order to prevent the signal-to-noise ratio from deteriorating even if the level of the input lowers in the A-D converter.

When the input signal is a color signal and the burst signal included therein is kept at a fixed level, if the input signal has a narrow band as the reproduced signal of the VCR (for example, when NTSC video signals are all subjected to FM modulation, the band width expands as wide as 15 MHz, but the VCR is not arranged to be capable of magnetic recording with frequencies higher than 8 MHz), the envelope of the burst signal is not in a rectangular waveform and distorted. Therefore, if the position at which the burst signal is to be extracted to detect the burst signal level deviates from the burst signal, there arises an error in the amplitude value (level) detected, thereby varying the level of the output signal of the variable gain amplifier, which has been a disadvantage of the conventional arrangement.

SUMMARY OF THE INVENTION

A first object of this invention is to realize a digital gain control apparatus which maintains the output signal at a fixed level, while making effective use of the dynamic range of the A-D converter.

A second object of this invention is to realize a digital gain control apparatus which has not much change in the level of the output signal even if the detecting position of the burst signal deviates from the burst signal.

In order to achieve the first object, the digital automatic gain control apparatus according to this invention comprises a first variable gain amplifier to vary the amplitude of the input signal, an A-D converter for analog-to-digital conversion of the output, a second variable gain amplifier to vary the amplitude of the output signal of the A-D converter, an amplitude detector to detect the amplitude of the output signal of the second variable gain amplifier, a first level comparator to compare the output with a first reference value, an integrator to integrate the output and thereby control the second variable gain amplifier, a second level comparator to compare the output of the integrator with a second reference value, and a control circuit to control the first variable gain amplifier according to the output.

In order to achieve the second object, the amplitude detector, a component of the digital automatic gain control apparatus according to this invention, has a function to calculate the rms (root mean square) value of the burst signal.

BRIEF DESCRIPTION OF THE DRAWINGS

FIG. 3 is a block diagram showing the arrangement of an amplitude detector in the embodiment presented in FIG. 1;

FIGS. 4A through 4D are waveform diagrams showing control signal waveforms of the above amplitude detector.

DESCRIPTION OF THE PREFERRED EMBODIMENTS

The digital automatic gain control apparatus according to an embodiment of this invention will be described with reference to the accompanying drawings.

Figure 1:
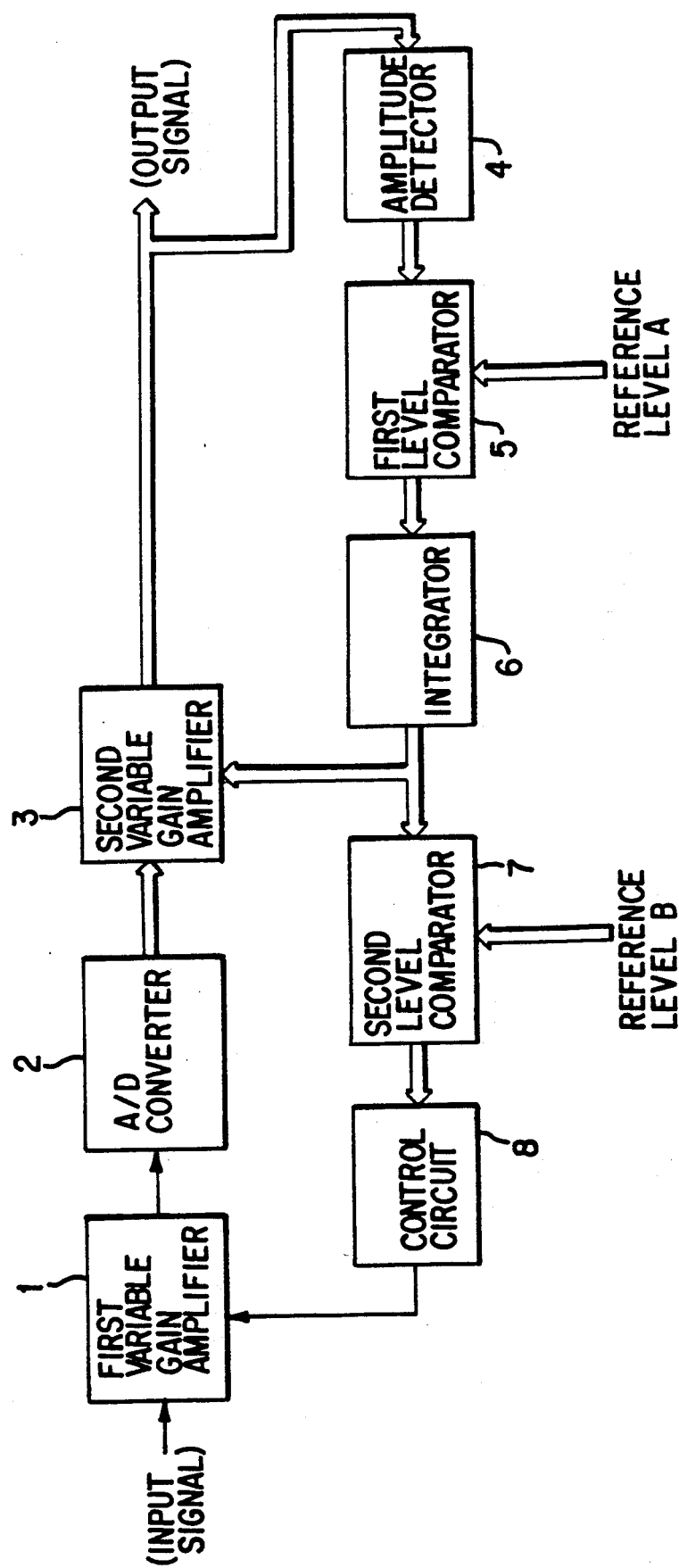
FIG. 1 is a block diagram showing the arrangement of a digital automatic gain control apparatus according to an embodiment of this invention.

FIG. 1 is a block diagram showing the arrangement of an embodiment of this invention. The solid lines indicate analog signals and the double lines indicate digital signals. In this embodiment, description is made of a case in which the input signal is a color signal including a burst signal.

In FIG. 1, the color signal of analog form, after amplified by a first variable gain amplifier 1, is converted by an A-D converter 2 into a digital signal, which is output to a second variable gain amplifier 3. The color signal of digital form is amplified by the second variable gain amplifier 3 and output. The second gain amplifier 3 can be realized by use of an adder, for example. An amplitude detector 4 detects the amplitude level of the burst signal from the output signal of the second variable gain amplifier 3. The amplitude is compared with a reference level A by a first level comparator 5. An integrator 6 integrates the output signal of the first level comparator 5 and controls the second variable gain amplifier 3. As a result, the amplitude level of the burst signal in the output signal of the second variable gain amplifier 3 becomes equal to the reference level A.

In the above operation, when the amplitude level of the input signal of the second variable gain amplifier 3 deceases, that is, when the amplitude level of the input signal of the A-D converter decreases, the gain of the second variable gain amplifier 3 increases, thereby controlling the amplitude level of the output signal so as to be at a fixed level at all times. Suppose that into the A-D converter, a color signal is input which has an amplitude level enough to make effective use of the dynamic range thereof, that is to say, enough to allot a sufficient number of bits of quantization. If the output of the integrator 6 at this time is denoted by x, when the amplitude level of the color signal input into the A-D converter 2 decreases, the output of the integrator 6 becomes larger than x, and conversely, when the amplitude level of the color signal increases, the output of the integrator 6 becomes smaller than x. Therefore, if the output of the integrator 6 is x, it follows that into the A-D converter, a color signal is currently input which has an amplitude level optimum, namely, enough to make effective use of the dynamic range thereof. Here, a comparison is made between the output of the integrator 6 and a reference level B by a second level comparator 7, and if, accordingly, the level B is set at the same value as the x of the output of the integrator 6 when a color signal is input into the A-D converter with an amplitude level enough to make effective use of the dynamic range thereof, and if the first variable gain amplifier 1 is controlled by a control circuit 8 to amplify the amplitude of the input color signal to a specified level, it is possible to input a color signal with an amplitude level enough to allot an optimum, or sufficient number of bits of quantization.

Figure 2A:
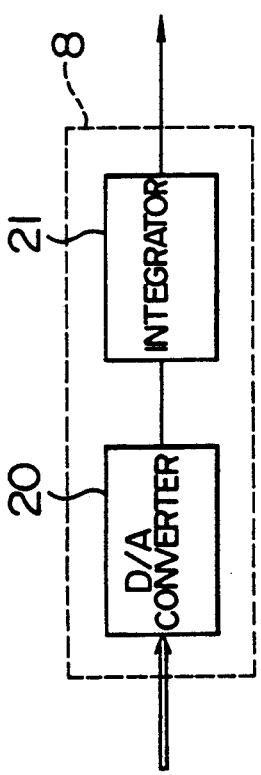
FIGS. 2A through 2C are block diagrams showing the arrangement of a control circuit in the embodiment presented in FIG. 1.
Figure 2B:
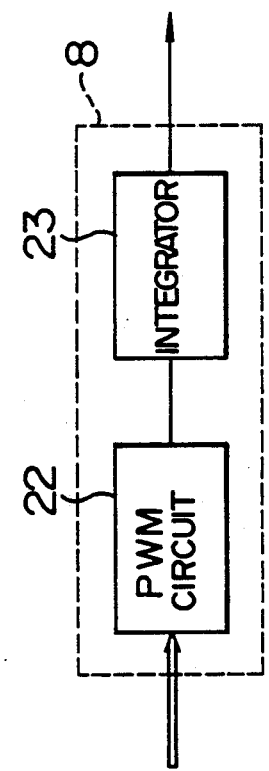
Figure 2C:
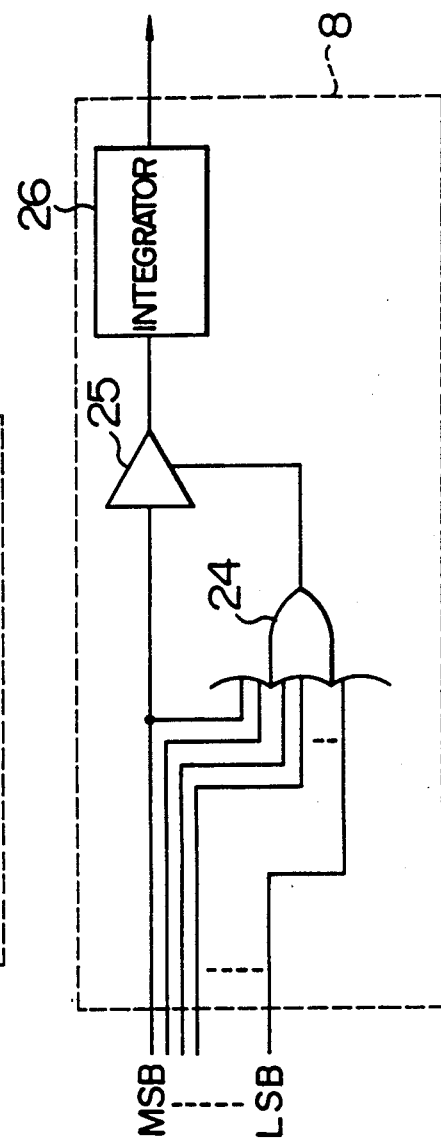

Referring to FIGS. 2A through 2C showing examples of arrangement of the control circuit 8, their arrangement and operation will be described.

FIG. 2A shows a control circuit 8 which is composed of a D-A converter 20 to convert the digital output of the second level comparator 7 into analog form, and an integrator 21 to integrate of the comparator 7. An analog low-pass filter, for example, is used as the integrator 21.

FIG. 2B shows a control circuit 8 composed of a PWM (Pulse Width Modulation) circuit 22 and an integrator 23. The PWM circuit 22 modulates the output of the second level comparator 7 into a PWM signal and outputs the signal. The PWM signal is subjected to filtering by a low-pass filter, thereby being converted into an analog voltage. Here, the integrator 23 also serves as a low-pass filter. In this case, a D-A converter is not required which converts the digital signal output by the second level comparator 7 into an analog signal.

FIG. 2C shows a control circuit 8 composed of an OR circuit 24 ("0" detection circuit) to find that the output of the second level comparator 7 is "0", a tri-state buffer 25, which allows the passage therethrough of the MSB (Most Significant Bit) of the output of the second level comparator 7 and the output of which has a high impedance when the output of the OR circuit 24 is "0", and an integrating circuit 26 to integrate this output. If the output of the second level comparator 7 is in its 2's complement form, for example, when the output is "0", all bits are "0s", and only in this case the output of the OR circuit is "0". The MSB of the output of the second level comparator 7 represents the polarity of the signal and at the same time indicates the large-small relationship between the output of the integrator 6 and the reference level B in FIG. 1 (for example, output of the integrator 6 > reference level B:MSB=0, output of the integrator 6 < reference level B:MSB=1). This MSB is integrated by the integrator 26 and the first variable gain amplifier 1 is controlled so that the output of the integrator 6 is equal to the reference level B.

When the output of the integrator 6 has become completely equal to the reference level B, that is, when the output of the second level comparator 7 has become "0", the output of the OR circuit 24 is "0", which is input into the tri-state buffer 25 to supply output with high impedance, thereby stopping the control of the first variable gain amplifier 1 by the control circuit 8.

A case in which the input signal is a color signal has been described. However, the effect of this invention is not limited to this case, can be applied to any kind of input signal by using a level detecting means (amplitude detector 4) suitable for the kind of a signal to be input, as the amplitude detector 4 is used to detect the amplitude level of the burst signal in this embodiment in which the input signal is a color signal.

Referring to FIGS. 3 through 5, description will now be made of the arrangement and operation of the amplitude detector 4 which squares and averages the amplitude of the burst signal in the input signal (color signal) for the burst period.

FIG. 3 is a block diagram showing a concrete arrangement of the amplitude detecting circuit 4.

In FIG. 3, the color signal in digital form output by the second variable gain amplifier 3 undergoes detection of its amplitude by the detection circuit 35. The output is squared by a square-law circuit 30, and is averaged to an output during the burst period by an averaging circuit 36 composed of an adder circuit 31, a D flip-flop 33 and a switch circuit 34, namely, the amplitude of the burst signal is averaged.

Various control signals to operate the averaging circuit are shown in FIGS. 4A through 4D. FIG. 4A is a clock pulse diagram of the switch circuit 34. Clock pulses are extracted only when the burst gate pulse (FIG. 4B) is high. Those extracted pulses are denoted by the signal x and the signal waveform is shown in FIG. 4C. The burst gate pulse is a pulse which goes to the 1 level during a burst period. The signal x is input into the (C) clock input of the D flip-flop 33. The D flip-flop 33 is first reset by a reset pulse (FIG. 4D). The Q output of the D flip-flop 33 is added with the output of the square-law circuit 30 and fed back to the D input of the D flip-flop 33. Therefore, it follows that the adder circuit 31 averages the output of the square-law circuit 30 during the burst period. The average value (the output of the adder circuit 31) is input into the square root circuit 32 where its square root is calculated. In other words, by the use of this amplitude detection circuit 4, the output of the second variable gain amplifier 3 is controlled so that the rms (root mean square) value of the amplitude of the burst signal included therein is constant.

Even if the color signal to be input is two color difference signals, a R-Y signal and a B-Y signal, since the R-Y signal and the B-Y signal intersect each other at right angles, it is only necessary to provide two square-law circuits and after squaring these signals separately, add up and input into the averaging circuit.

The square-law circuit 30 and the square root circuit 32 can be realized by a table of a ROM (Read Only Memory).

Referring to FIG. 5, the effect of controlling the rms value so as to be constant will be described in the following.

Figure 5A:
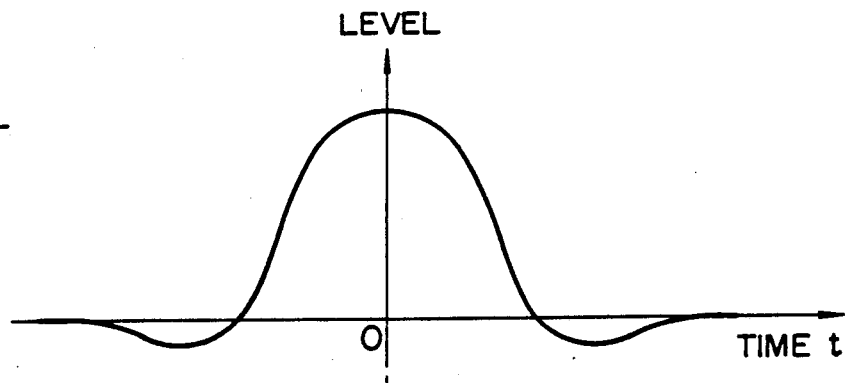
FIGS. 5A through 5D are waveform diagrams showing the operation of the above amplitude detector.

FIG. 5A shows the envelope waveform of a burst signal subjected to a band limitation like a reproduced signal of the VCR. FIG. 5C shows the values obtained by averaging the absolute values of the burst signal of FIG. 5A and FIG. 5D shows the rms values derived from the burst signal of FIG. 5A, both during the time period T of FIG. 5B when the burst gate pulse is at a high level. In FIGS. 5C and 5D, the axis of abscissa represents the position relative to the burst of the burst gate. The time when the center of the burst gate pulse coincides with the center of the burst signal is indicated by t=0, and at this time of this coincidence, the output is at its maximum. In other words, FIGS. 5C and 5D respectively indicate outputs of the average values in relation to the deviation of the burst gate from the burst.

Figure 5B:
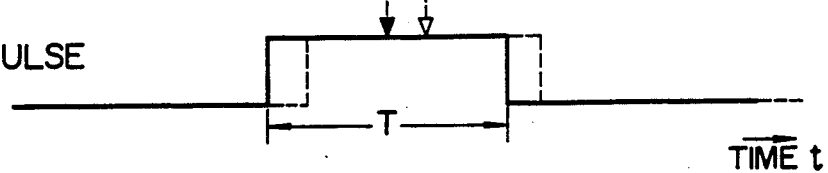
Figure 5C:
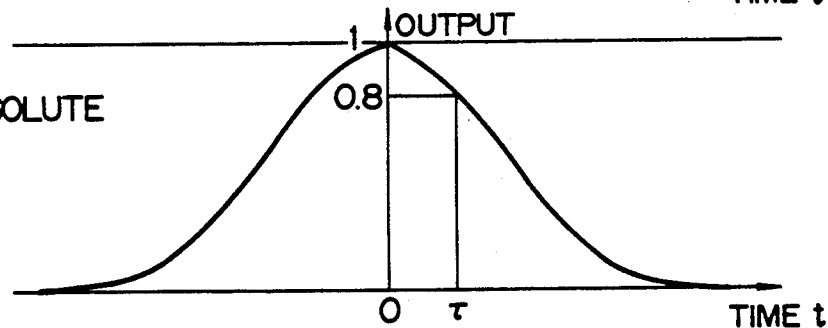
Figure 5D:
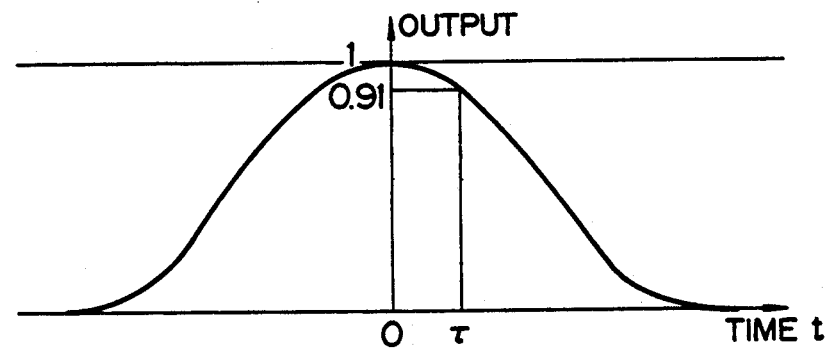

The waveform indicated by the dotted lines in FIG. 5B is shown to deviate by $\tau$ from the waveform indicated by the solid line. That is to say, the dotted-line waveform is of the burst gate pulse whose center deviates by $\tau$ from the center of the burst signal.

As is clear from FIGS. 5C and 5D, the variation of the output in relation to the deviation of the burst gate is less in the curve of the average absolute values than in the curve of the rms values.

For example, if the maximum output in the case where the burst pulse center coincides with the burst signal center is expressed by "1" and if output is compared in terms of a ratio to the maximum output of "1", when the center of the burst gate pulse deviates by $\tau$ from the center of the burst signal in contrast with the case where these centers coincide with each other (time t=0), output at $\tau$ in the average absolute values (FIG. 5C) is "0.8" and output at $\tau$ in the rms values (FIG. 5D) is "0.91". Therefore, an automatic gain controller using the rms values can minimize the variation in output caused by the deviation of the burst gate.

In this embodiment, there are provided two feedback loops, one being a digital system control loop to feed data back from the amplitude detector 4 to the second variable gain amplifier 3 and the other being an analog-system feedback loop to feed data back from the second level comparator 7 to the first variable gain amplifier 1, malfunctioning due to interference between the two loops can be prevented by setting the response of the analog-system feedback loop to occur later than the response of the digital-system feedback loop.

What is claimed is:

1. A digital automatic gain control apparatus comprising:
   a first variable gain amplifier for varying the amplitude of an input signal;
   an A-D converter for converting the analog output signal of said first variable gain amplifier into digital form;
   a second variable gain amplifier for varying the amplitude of the output signal of the A-D converter;
   an amplitude detector for detecting the amplitude of the output signal of said second variable gain amplifier;
   a first level comparator for comparing the output of said amplitude detector with a first reference value and outputting the difference;
   an integrator for integrating the output of said first level comparator and controlling said second gain amplifier;
   a second level comparator for comparing the output of said integrator with a second reference value and outputting the difference; and
   a control circuit for controlling said first variable gain amplifier according to the output of said second level comparator.

2. The digital automatic gain control apparatus according to claim 1, wherein the input signal is a color signal added with a burst signal, and wherein said amplitude detector comprises a square-law circuit for detecting the amplitude of the burst signal and squaring the value of the amplitude, an averaging circuit for averaging the output of said square-law circuit for a fixed period of time, and a square root circuit for calculating a square root of the output of said averaging circuit.

3. The digital automatic gain control apparatus according to claim 1, wherein said control circuit comprises a D-A converter for converting the output signal in digital form of said second level comparator into an analog signal, and an integrator for integrating the analog output signal.

4. The digital automatic gain control apparatus according to claim 1, wherein said control circuit comprises a PWM circuit for pulse-width modulation of the output signal in digital form of second level comparator, and an integrator for integrating the output signal.

5. The digital automatic gain control apparatus according to claim 1, wherein said control circuit comprises a "0" detection circuit for finding that the output signal in digital form of said second level comparator are "0", a tri-state buffer for allowing the Most Significant Bit of the output signal of said second level comparator to be input thereinto and supplying an output with high impedance when said "0" detection circuit detects "0", and an integrator for integrating the output of said tri-state buffer.

6. A digital automatic gain control apparatus comprising:
   a first variable gain amplifier for varying the amplitude of the input signal which is a color signal added with a burst signal;
   an A-D converter for converting the analog output signal of said first variable gain amplifier into digital form;
   a second variable gain amplifier for varying the amplitude of the output signal of said A-D converter;
   an amplitude detector for detecting the amplitude of the burst signal from the output signal of said second variable gain amplifier;
   a first level comparator for comparing the output of said amplitude detector with a first reference value and outputting the difference;
   a first integrator for integrating the output of said first level comparator and controlling said second variable gain amplifier;
   a second level comparator for comparing the output of said first integrator with a second reference value and outputting the difference; and
   a second integrator for integrating the output of said second level comparator and controlling said first gain amplifier.

7. The digital automatic gain control apparatus according to claim 6, wherein said amplitude detector comprises a square-law circuit for detecting the amplitude of the burst signal and squaring the value of the amplitude, an averaging circuit for averaging the output of said square-law circuit for a fixed period of time, and a square root circuit for calculating a square root of the output of said averaging circuit.

8. The digital automatic gain control apparatus according to claim 6, wherein the color signal consists of two color difference signals, and wherein said amplitude detector comprises two square-law circuit for respectively squaring the levels of the burst signals of the two color difference signals, an adder circuit for calculating the sum of said two square-law circuits, an averaging circuit for averaging the output of said adder circuit for a fixed period of time, and a square root circuit for calculating a square root of the output of said averaging circuit.

9. The digital automatic gain control apparatus according to claim 6, wherein the second reference value is the output value of said first integrator when a signal with a specified amplitude is input into said A-D converter.

10. An automatic gain control method for simultaneously controlling the level of an analog signal passed through an analog variable gain amplifier and inputted to an A-D converter and the level of a digital signal outputted from said A-D converter and passed through a digital variable gain amplifier, comprising the steps of:
comparing the level of the digital signal with a given reference level to produce a difference signal;
integrating said difference signal to produce a control signal, thereby controlling the digital variable gain amplifier, so that the digital signal is maintained at a fixed level; and
comparing the level of the control signal with another given reference level to produce another difference signal;
thereby controlling the analog variable gain amplifier so that the analog signal is maintained at a fixed level.

* * * * *